(12) United States Patent
Hoogendam et al.

(10) Patent No.: US 8,860,923 B2
(45) Date of Patent: *Oct. 14, 2014

(54) LITHOGRAPHIC APPARATUS AND DEVICE MANUFACTURING METHOD

(75) Inventors: Christiaan Alexander Hoogendam, Veldhoven (NL); Bob Streefkerk, Tilburg (NL); Johannes Catharinus Hubertus Mulkens, Waalre (NL); Erik Theodorus Maria Bijlaart, Rosmalen (NL); Aleksey Yurievich Kolesnychenko, Helmond (NL); Erik Roelof Loopstra, Heeze (NL); Jeroen Johannes Sophia Maria Mertens, Duizel (NL); Bernardus Antonius Slaghekke, Veldhoven (NL); Patricius Aloysius Jacobus Tinnemans, Hapert (NL); Helmar Van Santen, Amsterdam (NL)

(73) Assignee: ASML Netherlands B.V., Veldhoven (NL)

( * ) Notice: Subject to any disclaimer, the term of this patent is extended or adjusted under 35 U.S.C. 154(b) by 434 days.

This patent is subject to a terminal disclaimer.

(21) Appl. No.: 13/240,803

(22) Filed: Sep. 22, 2011

(65) Prior Publication Data

US 2012/0013869 A1    Jan. 19, 2012

Related U.S. Application Data

(60) Continuation of application No. 12/976,174, filed on Dec. 22, 2010, now Pat. No. 8,638,418, which is a continuation of application No. 12/216,126, filed on Jun. 30, 2008, now Pat. No. 7,868,998, which is a division of application No. 10/966,110, filed on Oct. 18, 2004, now Pat. No. 7,411,653.

(30) Foreign Application Priority Data

Oct. 28, 2003  (EP) .................................. 03256820

(51) Int. Cl.
G03B 27/42     (2006.01)
G03B 27/52     (2006.01)
G03F 7/20      (2006.01)

(52) U.S. Cl.
CPC ........ *G03F 7/70341* (2013.01); *G03F 7/70808* (2013.01); *G03F 7/70866* (2013.01)
USPC .............................................. 355/53; 355/30

(58) Field of Classification Search
CPC ............ G03F 7/70341; G03F 7/70866; G03F 7/70808; G03F 7/70925
USPC ........................... 355/30, 53, 55, 77; 250/548
See application file for complete search history.

(56) References Cited

U.S. PATENT DOCUMENTS

| 3,573,975 A | 4/1971 | Dhaka et al. |
| 3,648,587 A * | 3/1972 | Stevens ........................ 355/44 |

(Continued)

FOREIGN PATENT DOCUMENTS

| DE | 206 607 | 2/1984 |
| DE | 221 563 | 4/1985 |

(Continued)

OTHER PUBLICATIONS

U.S. Office Action dated Jan. 25, 2013 in corresponding U.S. Appl. No. 12/850,487.

(Continued)

*Primary Examiner* — Hung Henry Nguyen
(74) *Attorney, Agent, or Firm* — Pillsbury Winthrop Shaw Pittman LLP

(57) ABSTRACT

Liquid is supplied to a space between the projection system and the substrate by an inlet. In an embodiment, an overflow region removes liquid above a given level. The overflow region may be arranged above the inlet and thus the liquid may be constantly refreshed and the pressure in the liquid may remain substantially constant.

20 Claims, 4 Drawing Sheets

(56) References Cited

U.S. PATENT DOCUMENTS

| | | |
|---|---|---|
| 3,721,827 A | 3/1973 | Reinheimer |
| 4,346,164 A | 8/1982 | Tabarelli et al. |
| 4,390,273 A | 6/1983 | Loebach et al. |
| 4,396,705 A | 8/1983 | Akeyama et al. |
| 4,480,910 A | 11/1984 | Takanashi et al. |
| 4,509,852 A | 4/1985 | Tabarelli et al. |
| 5,040,020 A | 8/1991 | Rauschenbach et al. |
| 5,365,051 A | 11/1994 | Suzuki et al. |
| 5,610,683 A | 3/1997 | Takahashi |
| 5,677,525 A | 10/1997 | Völcker et al. |
| 5,715,039 A | 2/1998 | Fukuda et al. |
| 5,762,747 A | 6/1998 | Park et al. |
| 5,825,043 A | 10/1998 | Suwa |
| 5,900,354 A | 5/1999 | Batchelder |
| 6,191,429 B1 | 2/2001 | Suwa |
| 6,236,634 B1 | 5/2001 | Lee et al. ............... 369/112 |
| 6,304,005 B1 | 10/2001 | Aoki et al. |
| 6,560,032 B2 | 5/2003 | Hatano |
| 6,600,547 B2 | 7/2003 | Watson et al. |
| 6,603,130 B1 | 8/2003 | Bisschops et al. |
| 6,633,365 B2 | 10/2003 | Suenaga |
| 6,788,477 B2 | 9/2004 | Lin |
| 6,809,794 B1 | 10/2004 | Sewell |
| 6,867,844 B2 | 3/2005 | Vogel et al. |
| 6,954,256 B2 | 10/2005 | Flagello et al. |
| 7,053,983 B2 | 5/2006 | Tokita |
| 7,073,542 B2 | 7/2006 | Iriguchi |
| 7,411,653 B2 | 8/2008 | Hoogendam et al. |
| 7,414,794 B2 | 8/2008 | Novak |
| 7,443,482 B2 | 10/2008 | Novak et al. |
| 7,826,031 B2 | 11/2010 | Hara et al. |
| 7,868,998 B2 | 1/2011 | Hoogendam et al. |
| 8,542,344 B2 * | 9/2013 | Hoogendam et al. ........ 355/55 |
| 2002/0020821 A1 | 2/2002 | Van Santen et al. ...... 250/492 |
| 2002/0129838 A1 | 9/2002 | Myland |
| 2002/0163629 A1 | 11/2002 | Switkes et al. |
| 2003/0030916 A1 | 2/2003 | Suenaga |
| 2003/0123040 A1 | 7/2003 | Almogy |
| 2003/0174408 A1 | 9/2003 | Rostalski et al. |
| 2004/0000627 A1 | 1/2004 | Schuster |
| 2004/0021844 A1 | 2/2004 | Suenaga |
| 2004/0075895 A1 | 4/2004 | Lin |
| 2004/0103950 A1 | 6/2004 | Iriguchi |
| 2004/0109237 A1 | 6/2004 | Epple et al. |
| 2004/0113043 A1 | 6/2004 | Ishikawa et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik et al. |
| 2004/0135099 A1 | 7/2004 | Simon et al. |
| 2004/0136494 A1 | 7/2004 | Lof et al. |
| 2004/0160582 A1 | 8/2004 | De Smit et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2005/0024609 A1 | 2/2005 | De Smit et al. |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0042554 A1 | 2/2005 | Dierichs et al. |
| 2005/0046934 A1 | 3/2005 | Ho et al. |
| 2005/0048220 A1 | 3/2005 | Mertens et al. |
| 2005/0048223 A1 | 3/2005 | Pawloski et al. |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0132914 A1 | 6/2005 | Mulkens et al. |
| 2005/0134815 A1 | 6/2005 | Van Santen et al. |
| 2005/0141098 A1 | 6/2005 | Schuster |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219499 A1 | 10/2005 | Zaal et al. |
| 2005/0225737 A1 | 10/2005 | Weissenrieder et al. |
| 2005/0270505 A1 | 12/2005 | Smith |
| 2006/0023182 A1 * | 2/2006 | Novak et al. ............... 355/53 |
| 2006/0261288 A1 | 11/2006 | Van Santen |
| 2007/0076183 A1 | 4/2007 | Hara et al. |
| 2007/0076303 A1 | 4/2007 | Novak |
| 2007/0132969 A1 | 6/2007 | Gellrich et al. |

FOREIGN PATENT DOCUMENTS

| | | |
|---|---|---|
| DE | 224 448 A1 | 7/1985 |
| DE | 224448 | 7/1985 |
| DE | 242880 | 2/1987 |
| EP | 0023231 | 2/1981 |
| EP | 0418427 | 3/1991 |
| EP | 0605103 | 7/1994 |
| EP | 0834773 | 4/1998 |
| EP | 1039511 | 9/2000 |
| EP | 1 420 302 A1 | 5/2004 |
| EP | 1 482 372 A1 | 12/2004 |
| EP | 1 494 079 A1 | 1/2005 |
| FR | 2474708 | 7/1981 |
| JP | A 57-153433 | 9/1982 |
| JP | 58-202448 | 11/1983 |
| JP | A 59-19912 | 2/1984 |
| JP | 62-065326 | 3/1987 |
| JP | A-62-65326 | 3/1987 |
| JP | 62-121417 | 6/1987 |
| JP | 63-157419 | 6/1988 |
| JP | A-2-97239 | 4/1990 |
| JP | 04-305915 | 10/1992 |
| JP | 04-305917 | 10/1992 |
| JP | A 05-62877 | 3/1993 |
| JP | 06-124873 | 5/1994 |
| JP | 07-132262 | 5/1995 |
| JP | 07-220990 | 8/1995 |
| JP | A 08-316125 | 11/1996 |
| JP | A-9-115794 | 5/1997 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |

(56) References Cited

FOREIGN PATENT DOCUMENTS

| | | |
|---|---|---|
| JP | 2000-058436 | 2/2000 |
| JP | 2001-091849 | 4/2001 |
| JP | 2003-297735 | 10/2003 |
| JP | 2004-193252 | 7/2004 |
| JP | 2004-356205 | 12/2004 |
| JP | 2005-085789 | 3/2005 |
| WO | WO 99/49504 | 9/1999 |
| WO | WO 02/091078 A1 | 11/2002 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A1 | 9/2004 |
| WO | WO 2004/081666 A1 | 9/2004 |
| WO | 2004/090956 | 10/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/015315 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |

OTHER PUBLICATIONS

U.S. Office Action dated Jan. 16, 2013 in corresponding U.S. Appl. No. 13/285,583.

M. Switkes et al., "Immersion Lithography at 157 nm", MIT Lincoln Lab, Orlando 2001-1, Dec. 17, 2001.

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—2003. Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", FUTURE FAB International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microfab., Microsyst.* 1(1):7-12 (2002).

Search Report for European Application No. 03256820.6, dated Sep. 13, 2004.

Information Disclosure Statement filed Dec. 1, 2006 for U.S. Appl. No. 11/606,914 to Novak.

Office Action dated Mar. 23, 2007 issued for U.S. Appl. No. 11/606,914.

Information Disclosure Statement filed Dec. 1, 2006 for U.S. Appl. No. 11/606,935 to Hara et al.

Search Report for European Application No. EP 04256585.3, dated Apr. 5, 2005.

Non-final Office Action as issued for U.S. Appl. No. 11/606,935, dated Mar. 4, 2008.

Non-final Office Action as issued for U.S. Appl. No. 11/606,935, dated Jul. 17, 2009.

Non-final Office Action as issued for U.S. Appl. No. 11/606,914, dated Mar. 23, 2007.

Non-final Office Action as issued for U.S. Appl. No. 11/606,914, dated Dec. 12, 2007.

(56) References Cited

OTHER PUBLICATIONS

Information Disclosure Statement as filed on Dec. 1, 2006 for U.S. Appl. No. 11/606,914.
English translation of Japanese Official Action issued on Feb. 20, 2009 in Japanese Application No. 2008-132385.
European Search Report and Written Opinion mailed Nov. 30, 2010 in related European patent application no. 10180248.
European Search Report and Written Opinion mailed Nov. 18, 2010 in related European patent application no. 10180309.
U.S. Office Action mailed Sep. 13, 2012 in corresponding U.S. Appl. No. 12/850,487.

* cited by examiner

LITHOGRAPHIC APPARATUS AND DEVICE MANUFACTURING METHOD

This application is a continuation application of U.S. patent application Ser. No. 12/976,174, filed Dec. 22, 2010, now U.S. Pat. No. 8,638,418, which is a continuation application of U.S. patent application Ser. No. 12/216,126, filed Jun. 30, 2008, now U.S. Pat. No. 7,868,998, which is a divisional application of U.S. patent application Ser. No. 10/966,110, filed Oct. 18, 2004, now U.S. Pat. No. 7,411,653, which claims priority from European patent application EP 03256820.6, filed Oct. 28, 2003, each of the foregoing applications incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, on; or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

If liquid remains stationary in the space between the projection system and the substrate, a temperature fluctuation may cause a wavefront disturbance in the projection beam and thus may cause an error in the projected image. Thus, the liquid should be refreshed periodically. However, removal or supply of liquid may cause a mechanical vibration that disturbs the exposure, particularly if such removal or supply is in or near a seal used to contain the liquid between the substrate and the projection system. Further or alternatively, the pressure involved in liquid refreshment may be high and the projection system may be sensitive to a pressure variation which could cause a deformation in an optical element of the projection system or cause a disturbance in the projection system.

Additionally or alternatively, the motion of the substrate relative to the projection system may generate a pressure gradient. In some circumstances, this may lead to the liquid being swept from underneath the projection system. If the liquid is non-uniform under the projection system, or if gas bubbles are present under the projection system, the accuracy of the exposure may be compromised.

Accordingly, it would be advantageous, for example, to provide a system in which a pressure fluctuation and/or temperature variation in the liquid is reduced without introducing an unnecessary disturbance due to mechanical vibration.

According to an aspect of the invention, there is provided a lithographic projection apparatus, comprising:

a support structure configured to support a patterning device, the patterning device configured to pattern a beam of radiation according to a desired pattern;

a substrate table configured to hold a substrate;

a projection system configured to project the patterned beam onto a target portion of the substrate; and a liquid supply system configured to at least partly fill a space between the projection system and the substrate with a liquid to form a liquid reservoir, the liquid supply system comprising an overflow region from the liquid reservoir.

An overflow region from the liquid reservoir may be provided and excess liquid removed to another location. The overflow region may be used to maintain a liquid depth at a substantially constant level, thus reducing a pressure variation on the projection system attributable to a variable depth of liquid. In an embodiment, the liquid is removed by an outlet other than that used in or around a gas seal and so mechanical vibrations may be reduced. Due to the presence of the overflow region, liquid may be supplied at a high flow rate. A high rate of liquid replacement can ensure that the liquid doesn't heat up too much and also reduce contamination of the liquid by the resist. According to an embodiment, the overflow region is the outlet liquid supply system.

In an embodiment, the apparatus further comprises an inlet configured to provide liquid to the space between the projection system and the substrate, the overflow region being arranged above the inlet to facilitate the overflow region effectively removing the liquid. The liquid may be bounded by a barrier and an entrance to the overflow region is positioned on the opposite side of the barrier from the liquid. Thus only when the liquid is outside the boundary of the barrier is it removed by the overflow region. In an embodiment, the overflow region is arranged such that the liquid only flows into the overflow region when the liquid flows over the top of the barrier. The overflow region can be arranged so that it is at the same height as the top of the barrier or below the height of the barrier. For example, the barrier may form a ridge, the area of the ridge being larger than or equal to an area of a final element of the projection system configured to be in contact with the liquid. For simplicity the barrier may form part of the liquid supply system.

In order to maintain a pressure above the liquid at a certain level, the space above the liquid may be sealed with a gas tight member. Furthermore, the outlet may maintain the gas pressure above the liquid at a constant level by, for example, providing a suction force. Maintaining the gas pressure above the liquid at a constant level may reduce a pressure variation on the projection system.

According to another aspect of the invention, there is provided a lithographic projection apparatus, comprising:

a support structure configured to support a patterning device, the patterning device configured to pattern a beam of radiation according to a desired pattern;

a substrate table configured to hold a substrate;

a projection system configured to project the patterned beam onto a target portion of the substrate; and a liquid supply system configured to at least partly fill a space between the projection system and the substrate with a liquid, the liquid supply system comprising an inlet configured to provide liquid to the space and a liquid confinement structure extending along at least a part of the boundary of the space, the inlet being adjacent to an inner periphery of the liquid confinement structure and directed towards the target portion of the substrate.

Through the use of an inlet, the liquid directly under the projection system may be refreshed. The liquid flows from the inlet to an area directly under the projection system where it circulates before being removed via an outlet. This may be further aided by the liquid supply system being arranged with a passage, formed between an element of the projection system and a liquid confinement structure, for the flow of liquid towards an outlet. The flow of liquid towards the outlet is thus confined. The outlet may be arranged at the end of the passage. The liquid thus may have a minimal free surface such that there are few to no surface waves and the static hydraulic pressure area is reduced. Immersion liquid may be supplied to the inlet through a chamber. The chamber may be arranged to create only a small pressure drop between the chamber and the inlet. For example, the chamber may have a cross-sectional area greater than the cross-sectional area of the inlet.

According to another aspect of the invention, there is provided a lithographic projection apparatus comprising:

a support structure configured to support a patterning device, the patterning device configured to pattern a beam of radiation according to a desired pattern;

a substrate table configured to hold a substrate;

a projection system configured to project the patterned beam onto a target portion of the substrate; and a liquid supply system configured to at least partly fill a space between the projection system and the substrate with a liquid, the liquid supply system comprising:

a liquid confinement structure extending along at least a part of the boundary of the space, the liquid confinement structure and the projection system configured to form a capillary passage, and an outlet configured to remove liquid from the space and to remove the liquid at the end of at least part of the capillary passage.

A depth of liquid may be carefully controlled to a level defined by a capillary passage. The apparatus may further comprise an inlet configured to provide liquid to the space and to direct the liquid towards the target portion of the substrate, the inlet being adjacent to an inner periphery of a liquid confinement structure member. The liquid directly under the projection system, i.e. at the target portion of the substrate, may thus be refreshed continuously. This is the liquid most susceptible to overheating and contamination. In an embodiment, the inlet is a continuous groove around the projection system. In an embodiment, the flow rate of the outlet is greater than that of the inlet so that excess liquid does not accumulate and the depth of liquid remains at a level defined by the capillary passage.

According to a further aspect, there is provided a lithographic projection apparatus, comprising:

a support structure configured to support a patterning device, the patterning device configured to pattern a beam of radiation according to a desired pattern;

a substrate table configured to hold a substrate;

a projection system configured to project the patterned beam onto a target portion of the substrate;

a liquid supply system configured to at least partly fill a space between the projection system and the substrate with a liquid; and a barrier configured to bound the liquid, the barrier having a ridge with an area equal to or larger than the area of a surface of a final element of the projection system configured to be in contact with the liquid.

A ridge may be provided that has an area such that as the volume of immersion liquid between the projection system and the substrate increases above the level of the ridge, the depth of liquid only increases very slowly. Thus, a sudden variation in the pressure of the liquid between the projection system and the substrate due to a variation in the depth of the liquid may be reduced. For simplicity, the barrier may be part of the liquid supply system.

According to a further aspect, there is provided a lithographic projection apparatus comprising:

a support structure configured to support a patterning device, the patterning device configured to pattern a beam of radiation according to a desired pattern;

a substrate table configured to hold a substrate;

a projection system configured to project the patterned beam onto a target portion of the substrate; and a liquid supply system configured to at least partly fill a space between the projection system and the substrate with a liquid, the liquid supply system comprising an inlet configured to provide liquid to the space and a valve configured to connect the inlet to a high vacuum source.

If there is an apparatus failure (e.g. the substrate table is suddenly removed or failure of a seal), the liquid inlet may be used to remove the liquid from the apparatus to help prevent liquid from leaking out over the apparatus and potentially damaging delicate components. As the inlet may often be closer to a lower end of the liquid volume, removing liquid through the inlet may be more effective and/or quicker than simply using an outlet. The inlet may therefore operate as an additional outlet to speed up extraction of the liquid in an emergency situation. A valve may be used to connect the inlet to a high vacuum source. When an apparatus failure occurs, the valve may quickly and simply connect the inlet to the high vacuum source. Optionally, the valve can be automatically operated upon an apparatus failure. In this way, liquid may be quickly and efficiently removed in the event of an apparatus error.

According to another aspect of the invention, there is provided a device manufacturing method, comprising:

providing a liquid between a projection system of a lithographic apparatus and a substrate;

providing an overflow region for the liquid; and projecting a patterned beam of radiation through the liquid onto a target portion of the substrate.

According to a further aspect of the invention, there is provided a device manufacturing method, comprising:

providing a liquid between a projection system of a lithographic apparatus and a substrate such that when an amount of liquid exceeds a certain level an increase in the amount of liquid does not cause a significant change in a depth of the liquid; and projecting a patterned beam of radiation through the liquid onto a target portion of the substrate.

According to a further aspect of the invention, there is provided a device manufacturing method, comprising:

providing a liquid between a projection system of a lithographic apparatus and a substrate through an inlet, the liquid being bounded at least in part by a liquid confinement structure and being directed towards a target portion of the substrate and the inlet being adjacent an inner periphery of the liquid confinement structure; and projecting a patterned beam of radiation through the liquid onto a target portion of the substrate.

According to another aspect of the invention, there is provided a device manufacturing method, comprising:

providing a liquid between a projection system of a lithographic apparatus and a substrate, a depth of the liquid being controlled by capillary forces, the capillary forces being between the projection system and a liquid confinement structure at least partly bounding the liquid; and projecting a patterned beam of radiation through the liquid onto a target portion of the substrate.

According to another aspect of the invention, there is provided a device manufacturing method, comprising:

providing a liquid between a projection system of a lithographic apparatus and a substrate through an inlet, the inlet being connectable to a high vacuum source; and projecting a patterned beam of radiation through the liquid onto a target portion of the substrate.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm).

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
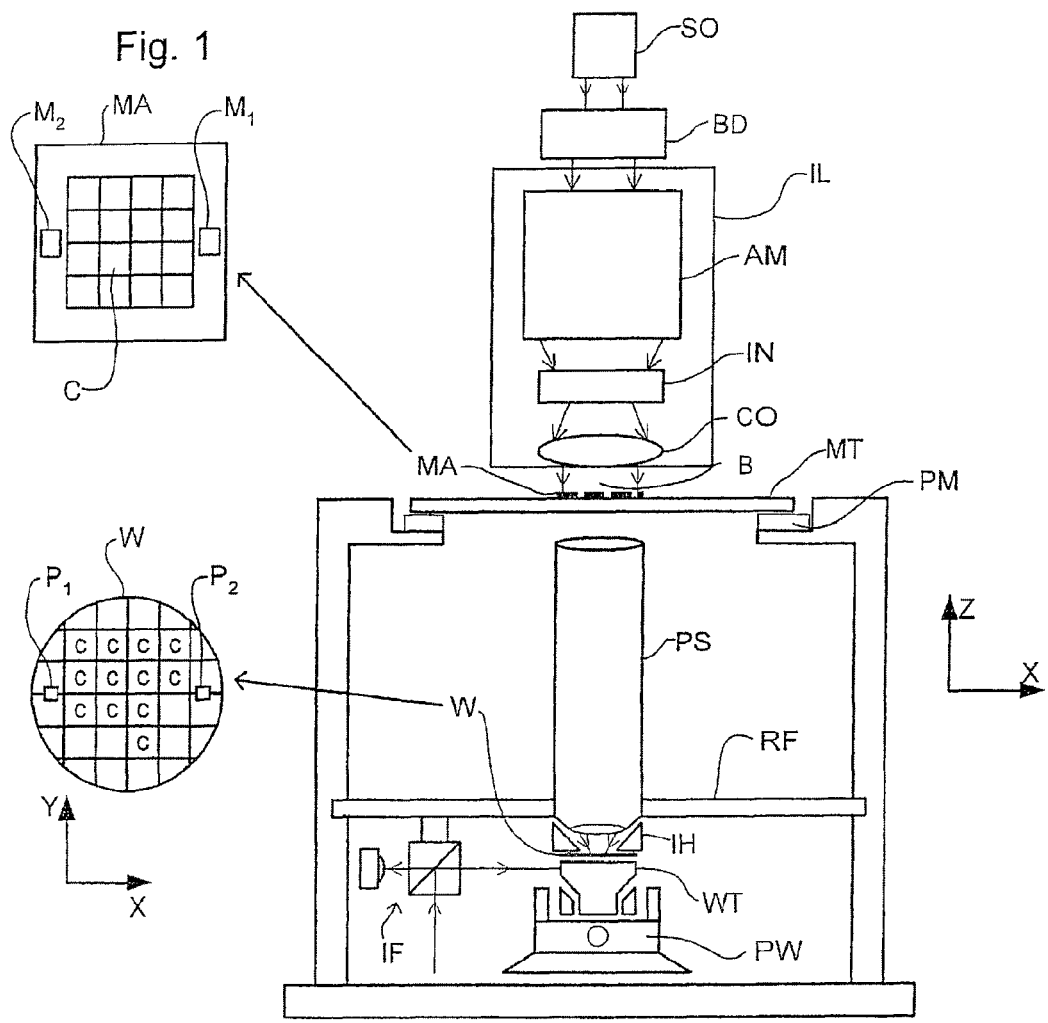
FIG. 1 depicts a lithographic apparatus according to an embodiment of the invention.
Figure 2:
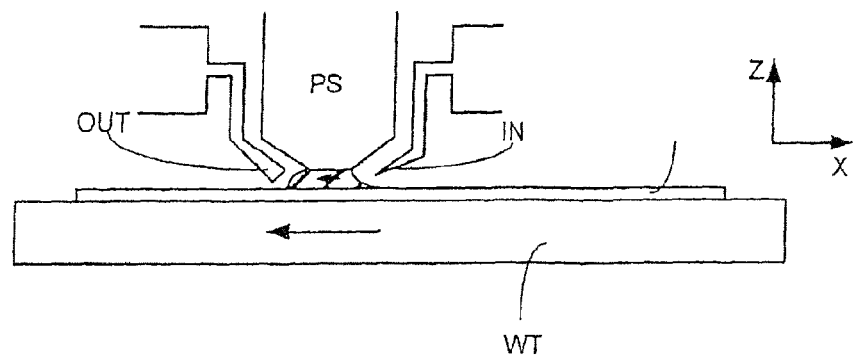
FIGS. 2 and 3 depict a liquid supply system for use in a lithographic projection apparatus.
Figure 3:
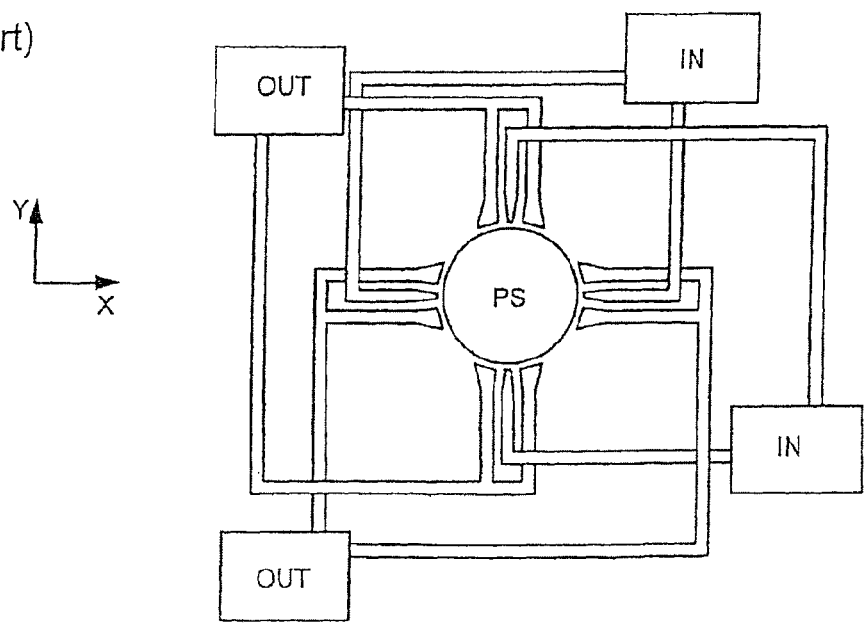

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 10:
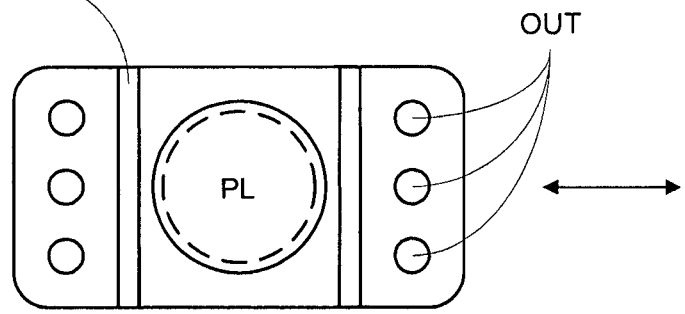
FIG. 10 depicts another liquid supply system for use in a lithographic projection apparatus.
Figure 10:
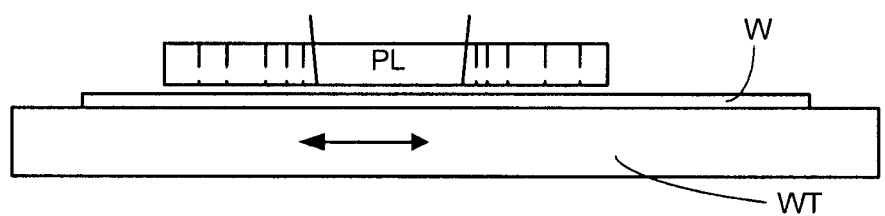

A further immersion lithography solution with a localized liquid supply system is shown in FIG. 10. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another immersion lithography solution with a localized liquid supply system solution which has been proposed is to provide the liquid supply system with a liquid confinement structure which extends along at least a part of a boundary of the space between the final element of the projection system and the substrate table. Such a solution is generally illustrated in FIGS. 4 to 9. The liquid confinement structure is substantially stationary relative to the projection system in the XY plane though there may be some relative movement in the Z direction (in the direction of the optical axis). A seal is formed between the liquid confinement structure and the surface of the substrate. In an embodiment, the seal is a contactless seal such as a gas seal. Such a system with a gas seal is disclosed in U.S. patent application Ser. No. 10/705,783, hereby incorporated in its entirety by reference.

Figure 4:
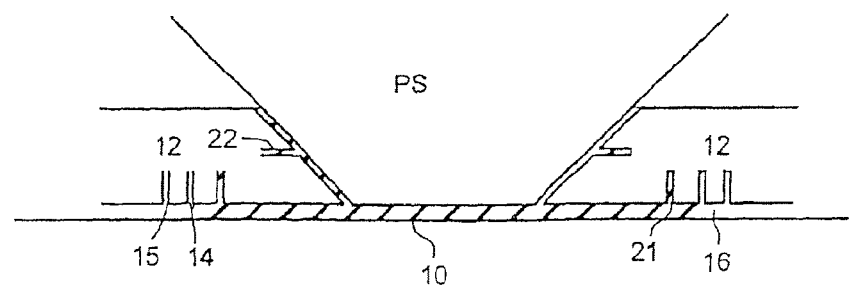
FIG. 4 is a detail of an immersion lithographic projection apparatus according to an embodiment of the invention.

As shown in FIG. 4, a liquid supply system according to an embodiment of the invention comprises a liquid reservoir 10 between the projection system and the substrate bounded by a seal 16 forming, for example, an annulus around the projection system. In an embodiment, the seal is formed by gas, e.g. air, synthetic air, $N_2$ or an inert gas, provided under pressure via inlet 15 to the gap between seal member 12 and the substrate and extracted via first outlet 14. The overpressure on the gas inlet 15, vacuum level on the first outlet 14 and geometry of the gap are arranged so that there is a high-velocity gas flow inwards that confines the liquid. The distance between the gas inlet and outlet and the substrate W is small The liquid reservoir is supplied with liquid by inlets 21 and 22 and excess liquid is removed via outlet 14. The liquid reservoir extends above the bottom of the final element of the projection system PS to the level where the seal member 12 bounding the liquid reservoir and forming a barrier suddenly widens as shown in FIG. 4. The top of the seal member forms a ridge, the area of which is similar to or larger than the area of the bottom of the final element of the projection system PL. Therefore, if the quantity of liquid in the reservoir 10 increases dramatically the depth of the reservoir 10 will not increase significantly as a large increase in the volume of liquid over the large area of the top of the seal member 12 will not generate a large change in the depth of the liquid in the reservoir 10. The pressure variations due to a change in the depth of the reservoir will therefore be minimal.

Figure 5:
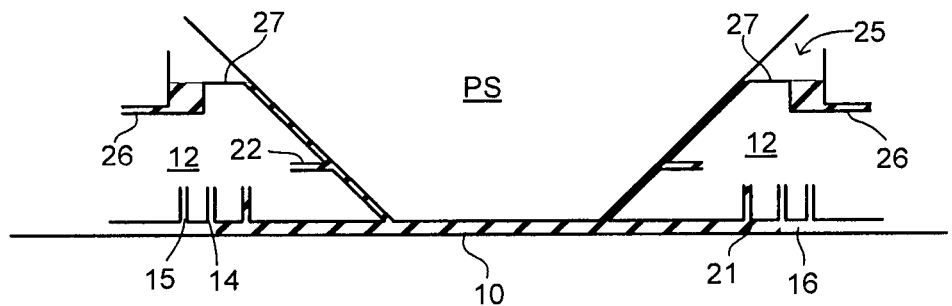
FIG. 5 is a detail of an immersion lithographic projection apparatus according to another embodiment of the invention.

FIG. 5 shows an alternative arrangement for the structure depicted in FIG. 4. An overflow structure 25 collects any excess liquid. The increase in depth of the liquid reservoir 10 due to an increase in the quantity of liquid is likely to be very small as a large amount of excess liquid can be accommodated in overflow structure 25. There is an annular or other shaped dike 27 forming a barrier bounding the liquid and as the amount of liquid increases it flows over dike 27 and into channel 26 which is an outlet that removes liquid from the reservoir 10. In this example, the majority of the liquid is removed via channel 26 rather than outlet 14. The depth of liquid is thus controlled by the height of the dike 27. As large amounts of liquid are not being removed via outlet 14, fewer vibrations may be induced in the seal member 12 and the seal 16 may function more effectively. The flow rate of channel 26 should be sufficiently low to ensure that the gas content in the flow is small. Channel 26 is arranged above inlets 21 and 22 so that the liquid overflows into channel 26.

Figure 6:
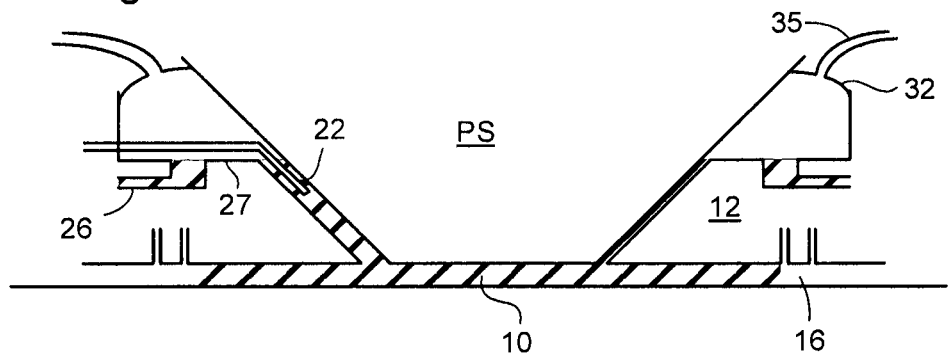
FIG. 6 is a detail of an immersion lithographic projection apparatus according to an further embodiment of the invention.

An embodiment shown in FIG. 6 is the same as the embodiments described above except for the aspects described below. In the embodiment of FIG. 6, there is just one inlet 22, separate from the seal member 12. Inlet 22 is formed between the projection system PS and the seal member 12 and liquid flows out from the inlet 22 at a height below that of the dike 27, but above that of the bottom of the final element of the projection system PS. Liquid is supplied at a constant rate R, but, similarly to the embodiment of FIG. 5, the liquid is predominantly removed via channel 26 rather than outlet 14. The rate of liquid removal through channel 26 is also a constant rate R. Seal 32 confines the gas around the reservoir 10 and prevents the moisture laden gas from pervading the whole apparatus, thus possibly damaging delicate parts and compromising the accuracy of measurements, e.g. interferometer readings. To keep the gas pressure above the reservoir 10 substantially constant, and thus the pressure at the final element of the projection system PS constant, there is a passage 35 through the seal 32 through which gas can flow. The passage 35 leads outside the apparatus to remove moisture laden gas. In an embodiment, the passage 35 should have a low resistance allowing the gas to flow freely.

Figure 7:
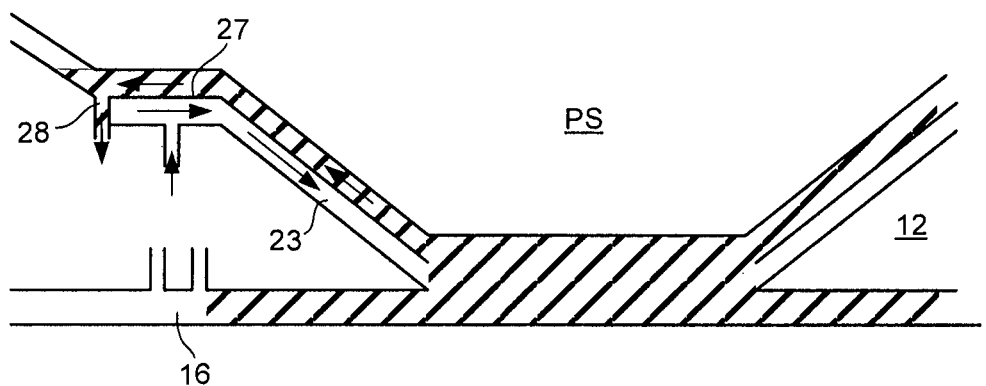
FIG. 7 is a detail of an immersion lithographic projection apparatus according to another embodiment of the invention.

Referring to an embodiment depicted in FIG. 7, liquid is supplied through a concentric ring (i.e. annular) shaped inlet 23 arranged on the inner circumference of the seal member 12. Inlet 23 has a slit width of approximately 20 µm to 300 µm, in an embodiment 150 µm, is arranged at a distance of approximately 0.5 mm from the substrate W and directs a channel of liquid towards the area directly under the projection system PS (i.e. the target portion) such that the liquid directly under the projection system PS is constantly refreshed. In this example, the inlet 23 forms the inner edge of the seal member 12, but it could also be arranged so it was just adjacent to the inner circumference of the seal member 12. Inlet 23 may be a plurality of pipes arranged on the inner circumference of the seal member 12. As shown in FIG. 7, a passage is formed between elements of the projection system PS and the seal member 12. Having circulated under the final element of the projection system PS, the liquid flows through this passage and over the dike 27 prior to being removed via outlet 28. However, unlike the earlier embodiments, elements of the projection system PS, or another part of the apparatus, bounds the upper level of the reservoir 10. Surface waves may therefore be prevented or reduced and static hydraulic pressures are limited resulting in a substantially continuous uniform pressure on the projection system PS.

Figure 8:
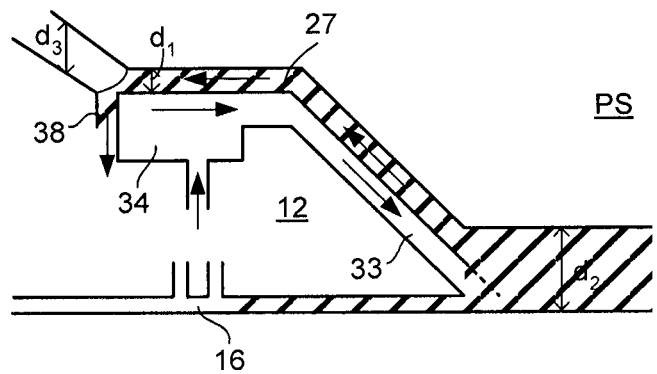
FIG. 8 is a detail of an immersion lithographic projection apparatus according to a further embodiment of the invention.

An embodiment of FIG. 8 is the same as the embodiment of FIG. 7 except for the aspects described below. Inlet 33 has an annular shape with a diameter of approximately 50-100 mm and a width of 20 µm to 300 µm, in an embodiment 150 µm. As shown in FIG. 8, the inlet 33 may end before the bottom of the seal member 12 or may extend to the bottom of the seal member 12. Liquid is supplied to inlet 33 through chamber 34 which has a greater cross-sectional area than inlet 33 to ensure that the chamber 34 provides a smaller restriction to flow In this embodiment, the seal member 12 and the projection system PS are arranged such that the liquid is held between the seal member 12 and the projection system PS by capillary forces at the level of dike 27.

The edges of seal member 12 slope toward the projection system PS with an angle to the direction of propagation of the radiation beam B of approximately 45°. Dike 27 intersects this slope and forms a broad ridge substantially perpendicular to the direction of propagation of the radiation beam B. The edges of projection system PS form a complimentary shape to the seal member 12 having a slope to the direction of propagation of the radiation beam B of approximately 45° and also having a broad area perpendicular to the direction of propagation of the radiation beam B radially outwardly of the slope.

Outlet 38 is arranged beyond dike 27 and has a greater flow rate than the rate of flow through inlet 33 to make sure that the amount of liquid in reservoir 10 is controlled. Some gas is also removed through outlet 38. Distance $d_1$ is governed by the actuation height of the seal member 12 and in this example is at least 2 mm. Distance $d_3$ should however be as large as possible to ensure that there is sufficient gas flow for outlet 38. This arrangement of apparatus ensures that the depth of liquid remains substantially constant at the level of the projection system PS just above dike 27.

To prevent the final element of the projection system PS from damage, the distance $d_1$ between dike 27 and the projection system PS is 2 mm whereas the distance $d_2$ between the final element of the projection system PS and the substrate is greater than 2 mm.

Figure 9:
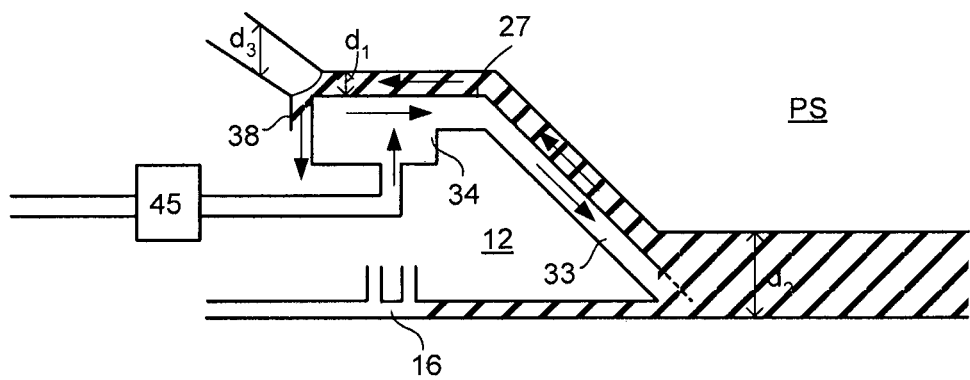
FIG. 9 is a detail of an immersion lithographic projection apparatus according to another embodiment of the invention.

Referring to an embodiment shown in FIG. 9, the flow of liquid through the inlet 33 is controlled by valve 45. During ordinary operation of the apparatus, valve 45 allows liquid to flow freely through inlet 33. However, when an error is detected in the system or apparatus, for example accidental removal of the substrate W and substrate table WT or a servo error, valve 45 automatically connects inlet 33 to a high vacuum chamber (not shown in the accompanying drawings). The liquid may therefore be quickly removed from the reservoir. The valve 45 and associated vacuum chamber may be connected to other inlets e.g. inlets 21 and 23 shown in one or more embodiments described above.

In an embodiment, there is provided a lithographic projection apparatus, comprising: a support structure configured to support a patterning device, the patterning device configured to pattern a beam of radiation according to a desired pattern; a substrate table configured to hold a substrate; a projection system configured to project the patterned beam onto a target portion of the substrate; and a liquid supply system configured to at least partly fill a space between the projection system and the substrate with a liquid to form a liquid reservoir, the liquid supply system comprising an overflow region from the liquid reservoir.

In an embodiment, the apparatus further comprises an inlet configured to provide liquid to the space, wherein the overflow region is arranged above the inlet. In an embodiment, the apparatus comprises a barrier configured to bound the liquid, an entrance to the overflow region being positioned on the opposite side of the barrier. In an embodiment, the overflow region is arranged such that the liquid only flows into the overflow region when the liquid flows over the top of the barrier. In an embodiment, the barrier forms part of the liquid supply system. In an embodiment, the barrier forms a ridge having an area which is not insignificant compared to an area of a final element of the projection system. In an embodiment, the space above the liquid is sealed with a gas tight member. In an embodiment, the overflow region maintains the pressure above the liquid at a substantially constant level. In an embodiment, the apparatus further comprises a liquid confinement structure extending along at least a part of the boundary of the space between the projection system and the substrate, the liquid confinement structure and the projection system configured to form a capillary passage, the overflow region being arranged to remove liquid at the end of at least part of the capillary passage. In an embodiment, the apparatus further comprises a liquid confinement structure extending along at least a part of the boundary of the space between the projection system and the substrate and an inlet configured to provide liquid to the space, the inlet being adjacent to an inner periphery of the liquid confinement structure and directed towards the target portion of the substrate. In an embodiment, the liquid reservoir covers a smaller area than the substrate.

In an embodiment, there is provided a lithographic projection apparatus, comprising: a support structure configured to support a patterning device, the patterning device configured to pattern a beam of radiation according to a desired pattern; a substrate table configured to hold a substrate; a projection system configured to project the patterned beam onto a target portion of the substrate; a liquid supply system configured to at least partly fill a space between the projection system and the substrate with a liquid; and a barrier configured to bound the liquid, the barrier having a ridge with an area equal to or larger than the area of a surface of a final element of the projection system configured to be in contact with the liquid.

In an embodiment, the barrier is part of the liquid supply system. In an embodiment, the apparatus further comprises a liquid confinement structure extending along at least a part of the boundary of the space between the projection system and the substrate, the liquid confinement structure and the projection system configured to form a capillary passage; and an outlet configured to remove liquid from the space and to remove the liquid at the end of at least part of the capillary passage. In an embodiment, the apparatus further comprises a liquid confinement structure extending along at least a part of the boundary of the space between the projection system and the substrate; and an inlet configured to provide liquid to the space, the inlet being adjacent to an inner periphery of the liquid confinement structure and directed towards the target portion of the substrate. In an embodiment, the space covers a smaller area than the substrate.

In an embodiment, there is provided a lithographic projection apparatus, comprising: a support structure configured to support a patterning device, the patterning device configured to pattern a beam of radiation according to a desired pattern; a substrate table configured to hold a substrate; a projection system configured to project the patterned beam onto a target portion of the substrate; and a liquid supply system configured to at least partly fill a space between the projection system and the substrate with a liquid, the liquid supply system comprising an inlet configured to provide liquid to the space and a liquid confinement structure extending along at least a part of the boundary of the space, the inlet being adjacent to an inner periphery of the liquid confinement structure and directed towards the target portion of the substrate.

In an embodiment, the apparatus comprises an outlet; and a passage formed between an element of the projection system and the liquid confinement structure configured for a flow of liquid towards the outlet. In an embodiment, the outlet is at the end of the passage. In an embodiment, the apparatus further comprises a chamber, through which the liquid is supplied to the inlet, the chamber having a cross-sectional area larger than a cross-sectional area of the inlet. In an embodiment, the liquid confinement structure and the projection system are configured to form a capillary passage and further comprising an outlet configured to remove liquid from the space and to remove the liquid at the end of at least part of the capillary passage. In an embodiment, the apparatus further comprises an overflow region. In an embodiment, the space covers a smaller area than the substrate.

In an embodiment, there is provided a lithographic projection apparatus comprising: a support structure configured to support a patterning device, the patterning device configured to pattern a beam of radiation according to a desired pattern; a substrate table configured to hold a substrate; a projection system configured to project the patterned beam onto a target portion of the substrate; and a liquid supply system configured to at least partly fill a space between the projection system and the substrate with a liquid, the liquid supply system comprising: a liquid confinement structure extending along at least a part of the boundary of the space, the liquid confinement structure and the projection system configured to form a capillary passage, and an outlet configured to remove liquid from the space and to remove the liquid at the end of at least part of the capillary passage.

In an embodiment, the apparatus further comprises an inlet configured to provide liquid to the space and wherein the flow rate of the outlet is greater than the flow rate of the inlet. In an embodiment, the apparatus further comprises an inlet configured to provide liquid to the space, the inlet being adjacent to an inner periphery of the liquid confinement structure and directed towards the target portion of the substrate. In an embodiment, the apparatus further comprises an overflow region. In an embodiment, the space covers a smaller area than the substrate.

In an embodiment, there is provided a lithographic projection apparatus comprising: a support structure configured to support a patterning device, the patterning device configured to pattern a beam of radiation according to a desired pattern; a substrate table configured to hold a substrate; a projection system configured to project the patterned beam onto a target portion of the substrate; and a liquid supply system configured to at least partly fill a space between the projection system and the substrate with a liquid, the liquid supply system comprising an inlet configured to provide liquid to the space and a valve configured to connect the inlet to a high vacuum source.

In an embodiment, the inlet is configured to operate as an outlet when connected to the high vacuum source. In an embodiment, the valve is configured to be automatically operated upon an apparatus failure. In an embodiment, the liquid reservoir covers a smaller area than the substrate.

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more of the embodiments may be applied to any immersion lithography apparatus, in particular, but not exclusively, to those types mentioned above. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus, comprising:
a movable table;
a projection system configured to project a patterned beam onto a target portion of a substrate, the projection system comprising a final optical element having a bottom surface; and
a liquid supply system configured to at least partly fill a space between the projection system and the table with a liquid to form a liquid reservoir between the bottom surface and the table, the liquid supply system comprising an inlet to provide liquid to the space, and an overflow opening to accept liquid from the liquid reservoir only when the liquid exceeds a certain level above the bottom surface and to remove the liquid that exceeds the level.

2. The apparatus of claim 1, wherein the overflow opening is arranged above the inlet.

3. The apparatus of claim 1, further comprising a barrier configured to bound the liquid, the overflow opening positioned at a side of the barrier opposite to a side of the barrier that faces the table.

4. The apparatus of claim 3, wherein the overflow opening is arranged such that the liquid only flows into the overflow opening when the liquid flows over the top of the barrier.

5. The apparatus of claim 3, wherein the barrier comprises, in the side of the barrier that faces the table, an outlet to remove liquid from the space.

6. The apparatus of claim 1, further comprising a gas tight member configured to seal a space above the liquid.

7. The apparatus of claim 1, further comprising:
a liquid confinement structure extending along at least a part of the boundary of the space between the projection system and the table; and
a passage between at least part of the liquid confinement structure and the projection system, the overflow opening arranged to remove liquid at the end of at least part of the passage.

8. The apparatus of claim 1, further comprising a liquid confinement structure extending along at least a part of the boundary of the space between the projection system and the table and defining an aperture through which the patterned beam is projected, the aperture being between the projection system and the table; and
wherein the inlet to provide liquid to the space has an opening above the aperture, the inlet opening adjacent to an inner periphery of the liquid confinement structure.

9. The apparatus of claim 1, wherein the liquid reservoir covers a smaller area than the substrate.

10. The apparatus of claim 1, further comprising a liquid confinement structure extending along at least a part of the boundary of the space between the projection system and the table, the liquid confinement structure having the inlet to supply liquid to the space and the inlet is arranged to supply liquid to contact a surface, facing toward the table, of an optical element of the projection system, the inlet extending diagonally toward the table and having an opening between the surface of the optical element and the table.

11. The apparatus of claim 1, further comprising:
a liquid confinement structure extending along at least a part of the boundary of the space between the projection system and the table, the liquid confinement structure having a bottom surface facing the table and an upper surface above a surface, facing toward the table, of an optical element of the projection system, the overflow opening being at the upper surface; and
a passage between the optical element and at least part of the liquid confinement structure to allow movement of liquid to the overflow opening,
wherein the inlet to provide liquid has an opening that is located above the bottom surface, liquid from the inlet opening flowing to contact the surface of the optical element, flowing to below the bottom surface and flowing toward the overflow opening.

12. A lithographic projection apparatus comprising:
a movable table;
a projection system configured to project a patterned beam onto a target portion of a substrate, the projection system comprising a final optical element having a bottom surface; and
a liquid supply system configured to at least partly fill a space between the projection system and the table with a liquid to form a liquid reservoir, the liquid supply system comprising:
an inlet to provide liquid to the space, and
an overflow opening to accept liquid from the liquid reservoir only when the liquid exceeds a certain level above the bottom surface and to remove the liquid that exceeds the level, the inlet being below the certain level.

13. The apparatus of claim 12, further comprising a barrier configured to bound the liquid, the overflow opening positioned at a side of the barrier opposite to a side of the barrier that faces the table.

14. The apparatus of claim 12, further comprising:
a liquid confinement structure extending along at least a part of the boundary of the space between the projection system and the table and defining an aperture through which the patterned beam is projected, the aperture being between the projection system and the table; and
the inlet is configured to provide liquid to the space above the aperture, the inlet being adjacent to an inner periphery of the liquid confinement structure.

15. The apparatus of claim 12, further comprising:
a liquid confinement structure extending along at least a part of the boundary of the space between the projection system and the table, the liquid confinement structure having a bottom surface facing the table and an upper surface above the bottom surface of the final optical element, the overflow opening being at the upper surface; and
a passage between the final optical element and at least part of the liquid confinement structure to allow movement of liquid to the overflow opening,
wherein the liquid confinement structure comprises the inlet, the inlet having an opening that is located above the bottom surface of the liquid confinement structure, liquid from the inlet opening flowing to contact the bottom surface of the final optical element, flowing to below the bottom surface of the liquid confinement structure and flowing toward the overflow opening.

16. A lithographic projection apparatus, comprising:
a movable table;
a projection system configured to project a patterned beam onto a target portion of a substrate; and
a liquid handling system configured to at least partly fill a space between the projection system and the table with a liquid to form a liquid reservoir, the liquid handling system comprising:
an overflow opening to accept liquid from the liquid reservoir only when the liquid exceeds a certain level and to remove the liquid that exceeds the level, a liquid confinement structure extending along at least a part of the boundary of the space between the projection system and the table and defining an aperture through which the patterned beam is projected, the aperture being between the projection system and the table, and an inlet to provide liquid to the space above the aperture, the inlet adjacent to an inner periphery of the liquid confinement structure.

17. The apparatus of claim 16, wherein the overflow opening is positioned at a side of the liquid confinement structure opposite to a side of the liquid confinement structure that faces the table.

18. The apparatus of claim 16, wherein the inlet is below the certain level.

19. The apparatus of claim 16, further comprising a passage between an optical element of the projection system and at least part of the liquid confinement structure to allow movement of liquid to the overflow opening, wherein the liquid confinement structure has a bottom surface facing the table and an upper surface above a surface, facing toward the table, of the optical element, the overflow opening being at the upper surface, and wherein the inlet to provide liquid has an opening that is located above the bottom surface, liquid from the inlet opening flowing to contact the surface of the optical element, flowing to below the bottom surface and flowing toward the overflow opening.

20. A lithographic projection apparatus, comprising:

a movable table;

a projection system configured to project a patterned beam onto a target portion of a substrate; and a liquid supply system configured to at least partly fill a space between the projection system and the table with a liquid to form a liquid reservoir, the liquid supply system comprising:

an overflow opening to accept liquid from the liquid reservoir only when the liquid exceeds a certain level and to remove the liquid that exceeds the level, and an inlet to provide liquid to the space, wherein the overflow opening is arranged above the inlet.

\* \* \* \* \*